(12) United States Patent
Tian et al.

(10) Patent No.: US 7,119,444 B2
(45) Date of Patent: Oct. 10, 2006

(54) VERSATILE SYSTEM FOR CHARGE DISSIPATION IN THE FORMATION OF SEMICONDUCTOR DEVICE STRUCTURES

(75) Inventors: Weidong Tian, Dallas, TX (US);
Bradley Sucher, McKinney, TX (US);
Zafar Imam, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/917,763

(22) Filed: Aug. 13, 2004

(65) Prior Publication Data
US 2006/0033173 A1 Feb. 16, 2006

(51) Int. Cl.
*H01L 23/48* (2006.01)

(52) U.S. Cl. .............................. 257/774; 257/E23.067; 257/E23.145; 257/E21.577; 257/296

(58) Field of Classification Search ................ 257/774, 257/771, 770, 784, 296, 773, E23.011, E23.067, 257/E23.145, E21.577, E21.585
See application file for complete search history.

(56) References Cited
U.S. PATENT DOCUMENTS 5,293,059 A * 3/1994 Tamura ....................... 257/412
5,536,679 A * 7/1996 Park ............................ 438/637
6,569,729 B1 * 5/2003 Wu et al. .................... 438/219
6,917,115 B1 * 7/2005 Teramoto .................... 257/774

FOREIGN PATENT DOCUMENTS

JP          62-177945          *  8/1987

* cited by examiner

*Primary Examiner*—Nathan J. Flynn
*Assistant Examiner*—Tan Tran
(74) *Attorney, Agent, or Firm*—Peter K. McLarty; W. James Brady, III; Frederick J. Telecky, Jr.

(57) ABSTRACT

The present invention provides a system for dissipating any aberrant charge that may accumulate during the fabrication of a semiconductor device segment (200), obviating overstress or break down damage to a focal device structure (208) that might result from uncontrolled dissipation of the aberrant charge. A substrate (202) has first and second intermediate structures (204, 206) disposed atop the substrate, with the focal structure disposed atop the substrate therebetween. A first conductive structure (210) is disposed atop the second intermediate structure, the focal structure, and a portion of the first intermediate structure. A third intermediate structure (214) is disposed contiguously atop the first conductive structure and the first intermediate layer. A void (216) is formed in a peripheral region (218) of device segment, through the first and third intermediate layers down to the substrate. A second conductive structure (220) is disposed atop the third intermediate structure such that it couples the substrate through the void.

12 Claims, 3 Drawing Sheets

VERSATILE SYSTEM FOR CHARGE DISSIPATION IN THE FORMATION OF SEMICONDUCTOR DEVICE STRUCTURES

TECHNICAL FIELD OF THE INVENTION

The present invention relates generally to the field of semiconductor devices and, more particularly, to apparatus and methods for dissipating transient charge occurring during the formation of certain semiconductor device structures.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

The increased packing density of the integrated circuit generates numerous challenges to the semiconductor manufacturing process. Nearly every device must be smaller without degrading operational performance of the integrated circuitry. High packing density, low heat generation, and low power consumption, with good reliability must be maintained without any functional degradation. Increased packing density of integrated circuits is usually accompanied by smaller feature size and, correspondingly, smaller device geometries.

As semiconductor feature sizes and geometries are reduced, certain device structures become more sensitive to physical properties and behaviors of other nearby device structures. Minor changes in placement or configuration of a device structure can have a significant impact on the lifetime performance or reliability of an integrated circuit. Balancing competing sensitivities and characteristics of different structures within a circuit can be further complicated by technology-imposed design or layout limitations. A number of high-performance device fabrication technologies must impose certain design constraints (e.g., maximum interconnect width, maximum oxide thickness, minimum gate length) in order to provide required performance levels (e.g., low voltage operation).

Consider, for example, certain issues that arise during the production of certain CMOS transistor devices. Certain manufacturing processes often cause, directly or indirectly, disproportionately high stresses on critical CMOS features and structures. One CMOS device feature of particular concern is gate oxide. The electrical integrity and stability of gate oxide structure is critical to overall transistor performance and reliability. However, CMOS transistor gate oxides are extremely vulnerable to structural and parametric breakdown caused by electrical stresses generated within a semiconductor structure. This is especially true of relatively shallow gate oxides that are increasingly common in high performance commercial technologies. Generally, such gate oxides are substantially shallower than other surrounding oxide structures (e.g., field oxides), and therefore tend to be much more vulnerable. Partial or complete break down of, or damage to, such oxide structures can drastically degrade device performance, or destroy a device completely—having a significant detrimental impact on process yield or device reliability or performance.

A number of electric stresses—that may cause or contribute to the break down of gate oxide structures—occur during actual operation or testing of a post-fabrication semiconductor device. There are a number of electrical stresses, however, that occur during the fabrication of a semiconductor device that may potentially be as or more damaging than the post-fabrication stresses. Some such stresses are recognized and understood, and may be addressed in conventional fabrication processes. Other fabrication-related stresses may have not yet been recognized, or may have been recognized but not fully understood or addressed.

One apparently heretofore unrecognized or unaddressed phenomenon involves gate oxide damage induced by antenna-like capacitive coupling charges, and the effects of their discharge, emanating from collateral structures. This is particularly problematic when device structures in contact with or in proximity to a gate oxide structure are formed in certain conductor/insulator/conductor patterns—such as in the formation of capacitors within a semiconductor device.

A number of semiconductor processes (e.g., deposition, implant, plasma etch) are capable of inducing a charge on semiconductor structures formed of certain conductive materials (e.g., polysilicon, metal). In some cases, charge induced by semiconductor processes on a first conductive layer or structure may or may not be sufficient to overstress or fully break down an adjacent gate oxide structure directly or indirectly coupled thereto. Where, however, additional charge—induced by semiconductor processes on a second conductive layer or structure—capacitively couples with the charge already existing in the first conductive structure, overstress or full breakdown of the adjacent gate oxide often results. In many cases, the accumulated charge discharges to the substrate through the least resistive path (i.e., the gate oxide structure). This phenomenon is particularly problematic where the first and second conductive structures are disposed or configured in a capacitor or quasi-capacitor arrangement, having an insulating layer or structure disposed therebetween. Charge build-up and discharge is, in many cases, an inherent or intended operational characteristic of such arrangements. Unfortunately, although such structures and configurations are common and necessary in semiconductor device design and fabrication, their charge and discharge during device fabrication are often not recognized or accounted for.

As a result, there is a need for a system that effectively dissipates charge accumulated within semiconductor device structures—particularly capacitors and capacitor-like arrangements—during fabrication that limits damage to surrounding structures caused by the dissipation or discharge of that charge, improving overall circuit and system performance and reliability in an easy, efficient and cost-effective manner.

SUMMARY OF THE INVENTION

The present invention provides a versatile system, comprising a number of apparatus and methods, for effectively dissipating charge accumulated within certain semiconductor device structures during device fabrication. Comprehending various complications caused by antenna-like capacitive charging between certain conductive semiconductor structures, the system of the present invention obviates damage to surrounding structures caused by uncontrolled dissipation of that charge. The present invention provides simple yet effective alternate dissipation paths for accumulated charge—improving overall process yield and device reliability in an easy and cost-effective manner.

The present invention recognizes that electrical charge is induced in certain conductive semiconductor structures or layers (e.g., polysilicon, metal) during a number of fabrication processes (e.g., deposition, implant, plasma etch). Often that charge accumulates within a particular structure or layer, having no means to dissipate. This problem may be further compounded as more processing is performed to refine or add additional structures or layers. Under certain conditions, those additional structures or layers may accumulate additional charge that couples to and increases the charge already present. This accumulated charge pursues a path to ground (e.g., the substrate) in order to dissipate. Becoming significant enough to overcome certain thresholds or limits, the accumulated charge may discharge or dissipate to ground through an adjacent structure (e.g., gate oxide), causing damage to or destroying that structure. The present invention recognizes that the convenient and efficient provision of one or more alternate ground paths for such conductive structures obviates such concerns and problems with minimal impact on fabrication time or costs.

The present invention provides a convenient and efficient system that grounds conductive structures or layers of concern to a ground plane or layer (e.g., the semiconductor substrate), in a manner that does not impact device design or layout. The system of the present invention may be easily and efficiently implemented in a wide variety of commercial fabrication process. The present invention provides for the formation of a void or ablation through one or more intermediate layers to a ground plane or layer, prior to the formation or deposition of a conductive layer or structure of concern. As the conductive structure or layer is formed or deposited, it couples directly to the ground plane through the void. Depending upon the fabrication processes used, one or more voids may be formed along the perimeter of a particular die, or along the periphery of an entire wafer. The voids may be formed by a number of procedures or processes, and the number of voids may be varied to ensure proper coupling of the conductive layer to the ground plane.

More specifically, embodiments of the present invention provide structures and methods for dissipating any aberrant charge that may accumulate during the fabrication of a semiconductor device segment, obviating overstress or break down damage to a focal device structure that might otherwise result from uncontrolled dissipation of the aberrant charge. A substrate has first and second intermediate structures disposed atop the substrate, with the focal structure disposed atop the substrate therebetween. A first conductive structure is disposed atop the second intermediate structure, the focal structure, and a portion of the first intermediate structure. A third intermediate structure is disposed contiguously atop the first conductive structure and the first intermediate layer. A void is formed in a peripheral region of, or location along, the device segment, through the first and third intermediate layers down to the substrate. A second conductive structure is disposed atop the third intermediate structure, such that it couples the substrate through the void.

Other embodiments of the present invention provide a system for dissipating aberrant charge occurring in a conductive structure during the fabrication of a semiconductor device. A ground plane is provided, upon which one or more intermediate layers are disposed. A void is formed by laser ablation, through the one or more intermediate layers, providing a conductive access channel or opening to the ground plane. A conductive structure is disposed atop the one or more intermediate layers, coupling to the ground plane through the void. Any aberrant charge, accumulated in the conductive structure during device fabrication, thereby dissipates directly from the conductive structure to the ground plane.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention, along with the accompanying figures in which corresponding numerals in the different figures refer to corresponding parts and in which.

DETAILED DESCRIPTION OF THE INVENTION

Figure 1A:
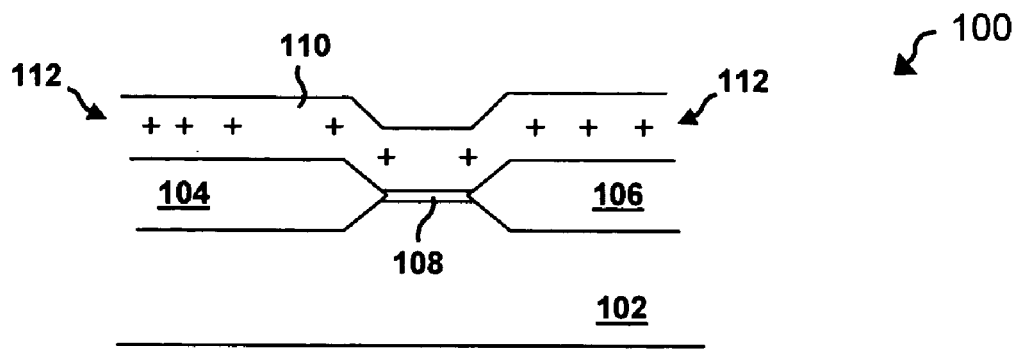
FIGS. 1a–1d provide illustrations depicting certain concerns arising during fabrication of a semiconductor segment without benefit of the present invention.

While the making and using of various embodiments of the present invention are discussed in detail below, it should be appreciated that the present invention provides many applicable inventive concepts, which can be embodied in a wide variety of specific contexts. Certain aspects of the present invention are hereafter illustratively described in conjunction with the formation of semiconductor capacitor structures having polysilicon and metal (e.g., Ti, Al) conductive layers. The specific embodiments discussed herein are, however, merely demonstrative of specific ways to make and use the invention and do not limit the scope of the invention.

The present invention recognizes that electrical charge is induced in certain conductive semiconductor structures or layers (e.g., polysilicon, metal) during a number of fabrication processes (e.g., deposition, implant, plasma etch). Often that charge accumulates within a particular structure or layer, having no means to dissipate. This problem may be further compounded as more processing is performed to refine or add additional structures or layers. Under certain conditions, those additional structures or layers may accumulate additional charge that couples to and increases the charge already present. This accumulated charge pursues a path to ground (e.g., the substrate) in order to dissipate. Becoming significant enough to overcome certain thresholds or limits, the accumulated charge may aberrantly discharge or dissipate to ground through an adjacent structure (e.g., gate oxide), causing damage to or destroying that structure. The present invention recognizes that the convenient and efficient provision of one or more alternate ground paths for such conductive structures obviates such concerns and problems with minimal impact on fabrication time or costs.

The present invention provides a convenient and efficient system that grounds conductive structures or layers of concern—particularly one or more conductive plates of a capacitor structure—to a ground plane or layer (e.g., the semiconductor substrate), in a manner that does not impact device design or layout. The system of the present invention may be easily and efficiently implemented in a wide variety of commercial fabrication process.

The present invention provides for the formation of a void or ablation through one or more intermediate layers to a ground plane or layer, prior to the formation or deposition of a conductive layer or structure of concern. As the conductive structure or layer is formed or deposited, it couples directly to the ground plane through the void. Depending upon the fabrication processes used, one or more voids (e.g., apertures, trenches, channels) may be formed in one or more suitable locations on a semiconductor wafer, such as along the perimeter of a particular die, along the periphery of part of or an entire wafer, or in scribe line or wafer identification areas. The voids may be formed by a number of procedures or processes, and the number of voids may be varied to ensure proper coupling of the conductive layer to the ground plane.

For purposes of explanation and illustration, it is useful to understand certain concerns that arise during the formation of certain semiconductor structures without benefit of the present invention. Consider, for example, the formation of a capacitive structure in a common semiconductor fabrication process, as depicted now with reference to FIGS. 1a–1d. A semiconductor device segment 100, depicted in FIG. 1a, comprises a substrate 102, and a first intermediate structure 104 (e.g., field oxide) and second intermediate structure 106 disposed atop substrate 102. A gate oxide structure 108, much shallower (e.g., ~100 Å) than structures 104 or 106, is disposed therebetween atop substrate 102. A polysilicon structure 110 is deposited atop structures 104–108.

During its deposition, or during subsequent handling or processing (e.g., implant, etch), structure 110 accumulates some amount of aberrant charge 112 (e.g., electrostatic charge). Within segment 100, the least resistive path to ground (i.e., substrate 102) is through gate oxide 108. Depending upon the particular composition or layout of segment 100, or its handling during fabrication, charge 112 may or may not aberrantly discharge through oxide 108 to substrate 102. Where charge 112 does discharge through oxide 108, it may cause partial or complete break down of the gate oxide. Where this discharge does not occur, structure 110 retains aberrant charge 112 as further processing is performed.

Figure 1B:
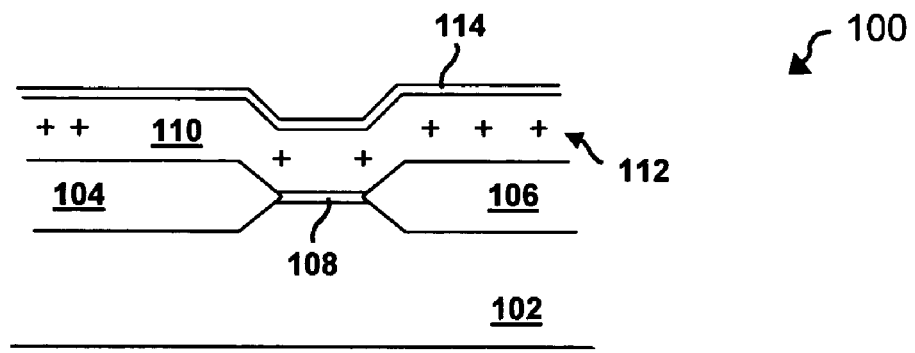
Figure 1C:
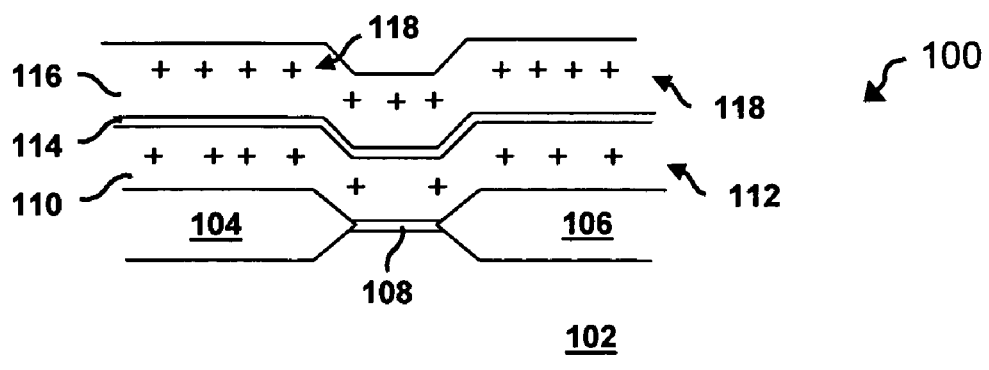
Figure 1D:
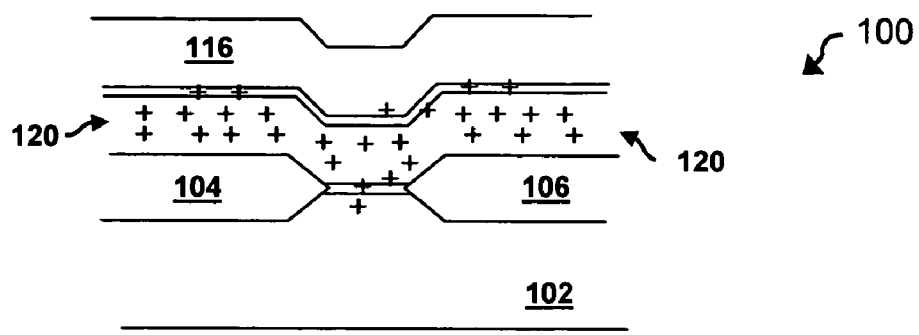

FIG. 1b depicts segment 100 after an insulator structure 114 (e.g., dielectric) has been deposited atop layer 110. Any aberrant charge 112 remaining in layer 110 is now captured therein, no longer having the ability to dissipate or discharge through the top of segment 100. FIG. 1c depicts the deposition of a metal structure 116 atop layer 114, which accumulates some amount of aberrant charge 118 during its deposition, or subsequent handling or processing. The aberrant charge 118 in layer 116 capacitively couples and adds to aberrant charge 112, building up a now substantial aberrant charge 120 in layer 110, as depicted now in FIG. 1d. For aberrant charge 120, the least resistive path to ground (i.e., substrate 102) is through gate oxide 108. When charge 120 builds to a sufficient magnitude, it discharges through oxide 108 to substrate 102. This aberrant discharge may cause partial or complete break down of the gate oxide—damage that may not be revealed or discovered until device testing or operation.

In contrast, a semiconductor fabrication process according to the present invention obviates such aberrant charge accumulations and discharges, and the problems or concerns caused thereby, by providing an efficient dissipation scheme for aberrant charges accumulated during fabrication. Certain aspects of the present invention are described in further detail now with reference to FIGS. 2a–2c.

Figure 2A:
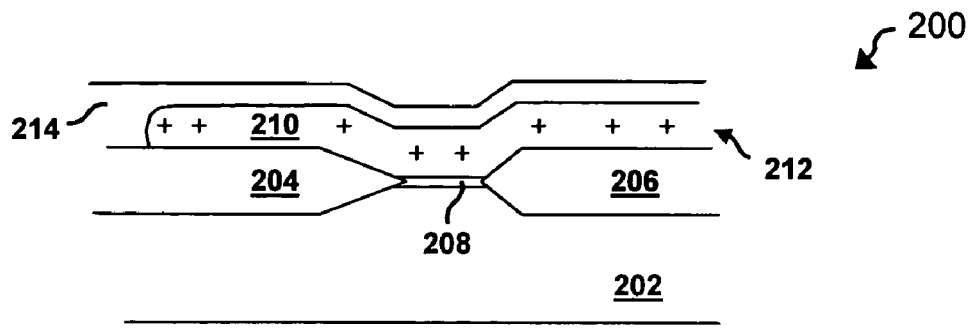
FIGS. 2a–2c provide illustrations depicting certain aspects of producing a semiconductor segment in accordance with the present invention.

As depicted now in FIG. 2a, a semiconductor device segment 200 according to the present invention comprises a ground plane or layer 202 (e.g., a semiconductor substrate), and a first intermediate structure 204 and second intermediate structure 206 (e.g., field oxide) disposed atop the ground layer 202. Aspects of the present invention are employed in segment 200 to protect a focal structure 208. Structure 208 may be any semiconductor device, structure or layer that is susceptible to damage as aberrant charge accumulations discharge therethrough to the ground layer. In the embodiment depicted in FIG. 2a, structure 208 comprises a gate oxide structure that is much shallower (e.g., ~100 Å) than structures 204 or 206, disposed therebetween atop layer 202. A first conductive structure or layer 210 (e.g., polysilicon) is deposited atop structures 204–208. In this particular embodiment, structure 210 comprises the lower conductive plate of a capacitor structure. Structure 210 is formed or disposed such that it distally covers only a portion of structure 204 in proximity to structure 208, terminating atop structure 204 thereafter.

During its deposition, or during subsequent handling or processing (e.g., implant, etch), structure 210 accumulates some amount of aberrant charge 212 (e.g., electrostatic charge). For purposes of illustration, it is assumed that charge 212 is not sufficient to damage structure 208 by aberrantly discharging therethrough to layer 202. In a number of embodiments, the fabrication and design processes utilized in producing segment 200 limit the size of structure 210 with respect to the other structures in segment 200, particularly structure 208, such that—even in worst-case conditions—structure 210 cannot accumulate enough charge 212 to damage structure 208. In other embodiments, where desired or required, the teachings of the present invention detailed hereinafter may also be applied to preemptively or proactively discharge charge 212 prior to further handling or processing.

Figure 2B:
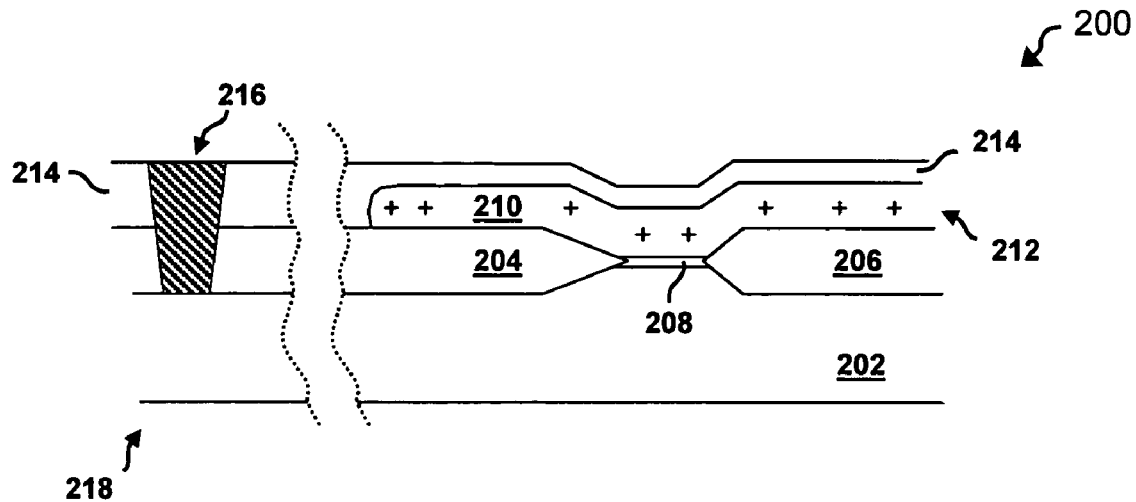

In this embodiment, however, structure 210 retains aberrant charge 212 as further processing is performed. A third intermediate structure or layer 214 is formed or disposed atop structures 210 and 204. At the terminal end of structure 210 over structure 204, structure 214 fills down to and contacts structure 204, extending for some distance beyond structure 210 and forming a contiguous top structure. Structure 214 comprises some insulating material or structure (e.g., dielectric), enclosing and retaining any aberrant charge 212 within layer 210. In this embodiment, structure 214 comprises the dielectric portion of a capacitor structure. Referring now to FIG. 2b, one or more voids, channels or other suitable openings 216 are formed in all of the layers or structures atop layer 202 (e.g., structures 204, 214), in a peripheral location or portion 218 along segment 200 that is sufficiently distally removed from electrical or structural proximity to structures 208 and 210. Voids 216 provide, as described hereinafter, an alternative dissipation path to layer 202.

Void 216 is formed of a suitable shape and dimension (e.g., cylindrical, conical, columnar) to provide conductive access to layer 202 in accordance with the present invention. Void 216 may also be formed in pattern with other voids to display or otherwise communicate some visible marking, identification or other device-related data along a semiconductor wafer comprising segment 200. In certain embodiments, for example, void 216 may be formed by laser ablation in a scribe pattern (i.e., laser scribe), providing wafer or lot data, along the periphery of a semiconductor wafer. In other embodiments, void 216 may be formed as part of the scribe line for an individual die on a semiconductor wafer. In alternative embodiments, void 216 may be formed by processes other than laser ablation, such as photolithography or etching. These and other similar variations are comprehended by the system of the present invention.

Figure 2C:
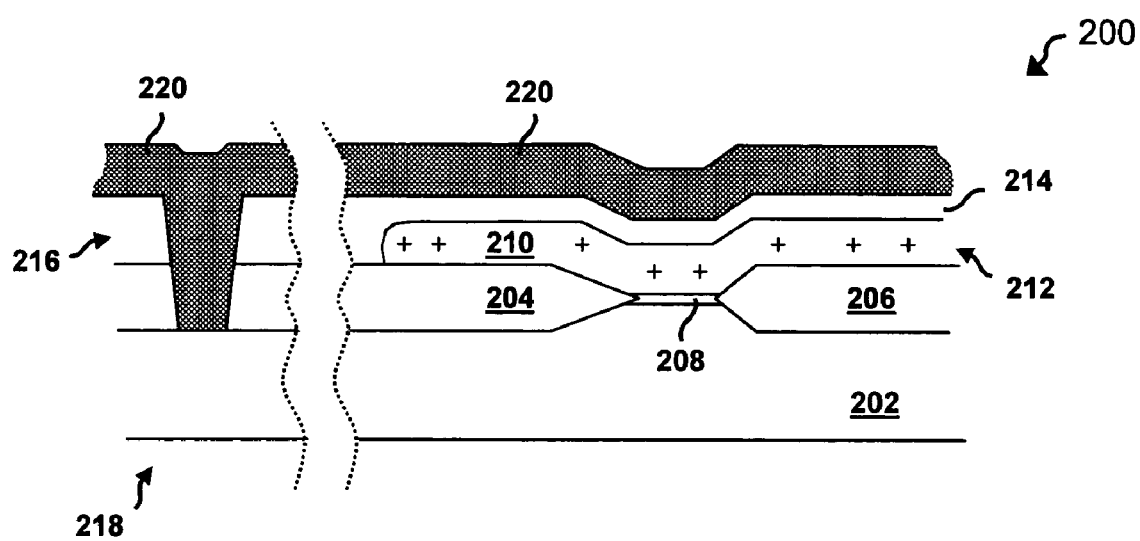

Referring now to FIG. 2c, a second conductive structure or layer 220 is deposited atop layer 214 and void 216. In this embodiment, structure 220 comprises some suitable metal layer (e.g., Al, Ti, Ta), and further comprises the upper conductive plate of a capacitor structure. As layer 220 is deposited or formed, it fills void 216 and couples directly to layer 202. To the extent that structure 220 is contiguous, all of structure 220 is thereby directly coupled to layer 202— having now a direct discharge path to ground. To the extent that structure 220 is not contiguous, or if otherwise desired or required, multiple instances of void 216 may be disposed in various locations to provide the desired coupling to ground. Any aberrant charge that may accumulate during the deposition of layer 220, or during subsequent handling or processing, dissipates directly to layer 202 without impacting structure 208. Since aberrant charge in structure 220 is dissipated immediately, there is no capacitive coupling and additional accumulation of aberrant charge in structure 210. Structure 208 is spared from any damaging aberrant discharge that might otherwise occur due to such accumulation.

Thus, by the present invention, damage caused to one semiconductor structure, caused by capacitive coupling of aberrant charge in two adjacent conductive structures, particularly constituent members of a capacitor structure, is obviated, by providing an alternative charge dissipation path or structure for one or more of the conductive structures. Depending upon the embodiment, the dissipation scheme may be employed to provide a discharge path for either the lower or upper conductive structures, or both. Furthermore, the alternative dissipation structures may be provided in a manner that serves additional marking or informational purposes, such as scribe lines or patterns. The system of the present invention is readily adaptable to a number of commercial semiconductor fabrication processes—requiring little or no labor or material overhead to implement. The system of the present invention is further adaptable to a number of semiconductor structures and materials.

The embodiments and examples set forth herein are therefore presented to best explain the present invention and its practical application, and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. As stated throughout, many modifications and variations are possible in light of the above teaching without departing from the spirit and scope of the following claims.

What is claimed is:

1. A semiconductor device comprising:
   a substrate;
   first and second intermediate structures disposed atop the substrate;
   a focal structure disposed atop the substrate between the first and second intermediate structures;
   a first conductive structure disposed atop the second intermediate structure, the focal structure, and a portion of the first intermediate structure;
   a third intermediate structure contiguously disposed atop the first conductive structure and the first intermediate structure;
   a void formed in a peripheral location that is distally removed from the focal structure and the first conductive structure, through the first and third intermediate structures to the substrate; and
   a second conductive structure, disposed atop the third intermediate structure and coupling to the substrate through the void.

2. The device of claim 1, wherein the focal structure comprises a gate oxide structure.

3. The device of claim 1, wherein the first conductive structure comprises polysilicon.

4. The device of claim 3, wherein the third intermediate structure comprises a dielectric and the second conductive structure comprises titanium.

5. The device of claim 1, wherein the third intermediate structure comprises a dielectric.

6. The device of claim 1, wherein the second conductive structure comprises metal.

7. The device of claim 6, wherein the second conductive structure comprises tantalum.

8. The device of claim 6, wherein the second condnctive structure comprises aluminum.

9. The device of claim 1, wherein the peripheral location is along the perimeter of a semiconductor wafer.

10. The device of claim 1, wherein the peripheral location is along the perimeter of a die.

11. The device of claim 1, wherein the void is formed as part of a scribe line.

12. The device of claim 1, wherein the void is formed as part of a scribe marking.

* * * * *